United States Patent
Waida

(10) Patent No.: US 6,504,354 B1
(45) Date of Patent: Jan. 7, 2003

(54) SIGNAL ANALYSIS APPARATUS HAVING YTO YTTRIUM-IRON GARNET TUNED OSCILLATOR

(75) Inventor: Yuichi Waida, Atsugi (JP)

(73) Assignee: Anritsu Corporation, Tokyo (JP)

(*) Notice: Subject to any disclaimer, the term of this patent is extended or adjusted under 35 U.S.C. 154(b) by 5 days.

(21) Appl. No.: 09/868,496

(22) PCT Filed: Nov. 13, 2000

(86) PCT No.: PCT/JP00/07996

§ 371 (c)(1),
(2), (4) Date: Jun. 18, 2001

(87) PCT Pub. No.: WO01/36989

PCT Pub. Date: May 25, 2001

(30) Foreign Application Priority Data

Nov. 16, 1999 (JP) .......................................... 11/325690

(51) Int. Cl.[7] .............................................. G01R 23/02
(52) U.S. Cl. ................. 324/76.39; 324/76.23; 324/76.27; 324/76.39; 331/4; 331/49
(58) Field of Search ................. 324/76.39, 76.27, 324/76.29, 76.23; 331/4, 49

(56) References Cited

U.S. PATENT DOCUMENTS

| 3,296,550 A | * | 1/1967 | Hukami et al. ............... 331/49 |
| 3,413,566 A | * | 11/1968 | Parkyn ......................... 331/49 |
| 3,711,784 A | * | 1/1973 | Heise ............................ 331/53 |
| 4,342,008 A | | 7/1982 | Jewett ........................... 331/49 |
| 4,858,159 A | * | 8/1989 | Wheelwright et al. ...... 702/106 |
| 5,028,886 A | * | 7/1991 | Seibel et al. .................... 331/4 |
| 6,018,702 A | * | 1/2000 | Luiz ............................. 702/107 |
| 6,147,560 A | * | 11/2000 | Erhage et al. ............... 331/1 R |
| 6,316,928 B1 | * | 11/2001 | Miyauchi ................. 324/76.27 |

FOREIGN PATENT DOCUMENTS

| JP | 63-65301 | 4/1988 |
| JP | 3-13002 | 1/1991 |

* cited by examiner

*Primary Examiner*—N. Le
*Assistant Examiner*—Wasseem H. Hamdan
(74) *Attorney, Agent, or Firm*—Frishauf, Holtz, Goodman & Chick, P.C.

(57) ABSTRACT

A sweep controller supplies a current to a YTO(YIG-Yttrium-Iron-Garnet Tuned Oscillator) from a current drive circuit in such a manner that frequencies corresponding to a first range in an oscillation frequency of the YTO designated as a desired frequency range for analysis with one sweep, and a second range designated as a frequency range higher than the first range for the analysis with the next one sweep are oscillated by the YTO. Moreover, the sweep controller outputs an instruction for increasing the current flowing through the YTO from the current drive circuit over a part of a period between an end of the first range and a start of the second range in order to shorten the period between the end of the first range and the start of the second range when it is detected that a difference between an end frequency of the first range and a start frequency of the second range is larger than a predetermined frequency difference.

10 Claims, 5 Drawing Sheets

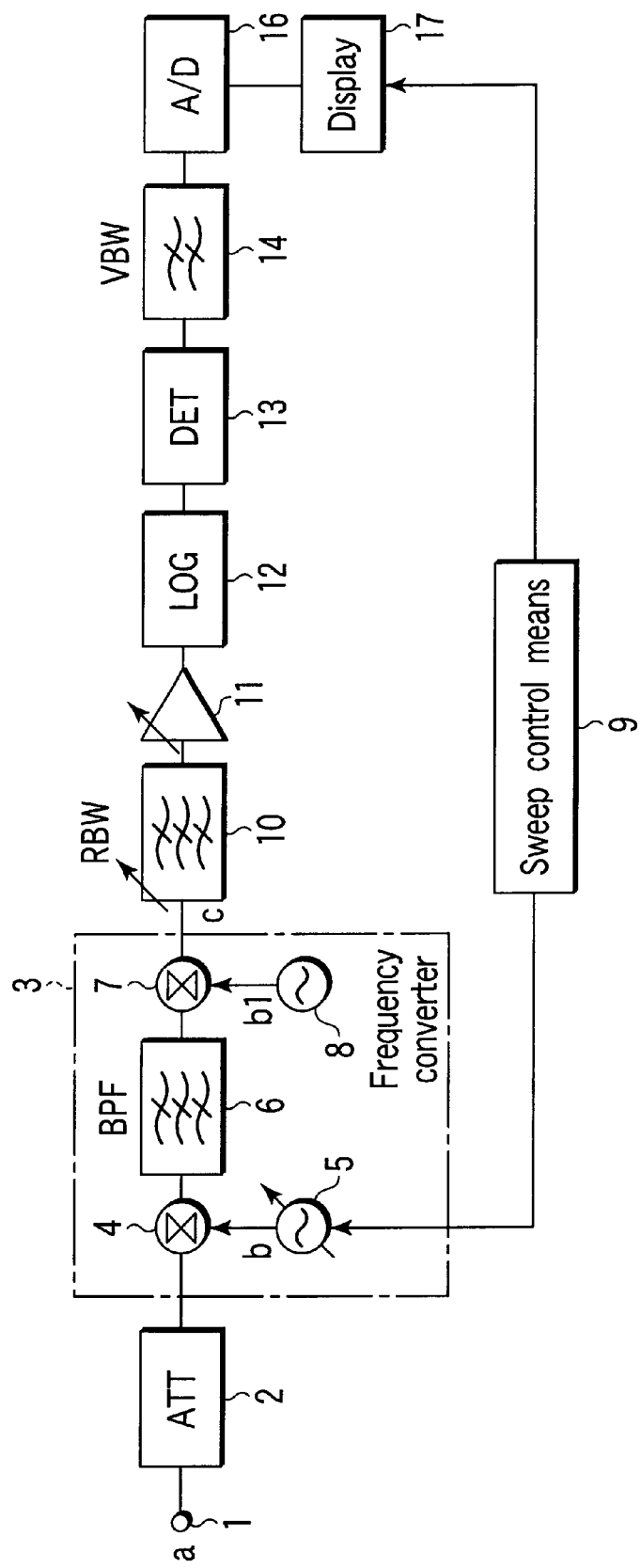
F I G. 1

SIGNAL ANALYSIS APPARATUS HAVING YTO YTTRIUM-IRON GARNET TUNED OSCILLATOR

This application is a U.S. National Phase Application under 35 USC 371 of International Application PCT/JP00/07996 (not published in English) filed Nov. 13, 2000.

TECHNICAL FIELD

The present invention relates to a signal analysis apparatus provided with YIG-Yttrium-Iron-Garnet-device-Tuned Oscillator (YTO), particularly to a signal analysis apparatus provided with a YTO, in which a response speed of YTO can be increased.

BACKGROUND ART

In general, in a signal analysis apparatus such as a spectrum analyzer, a YTO is disposed as a local oscillator in a frequency converter.

This YTO is an oscillator which uses YIG or another magnetic element to oscillate/output a high-frequency signal.

FIG. 6 is a block diagram showing a drive circuit portion of a conventional YTO.

In FIG. 6, a YTO drive circuit 50 has a control circuit 51, a sweep circuit 52, and a constant-current circuit 53.

Here, the constant-current circuit 53 controls a current value with respect to a YTO 55 based on a sawtooth-shaped sweep signal outputted from the sweep circuit 52, and a control signal outputted from the control circuit 51 to offset a sweep start frequency, and thereby sweeps and variably controls an oscillation frequency of the YTO 55, for example, in a frequency range of 3 to 8 GHz.

Additionally, a diode 56 prevents a voltage of a terminal A of the YTO 55 from reaching 0V or more.

Moreover, in the signal analysis apparatus such as a spectrum analyzer (not shown), a high-frequency signal output from the YTO 55 by variable control of the oscillation frequency with respect to the YTO 55 is used, signal analysis processings (e.g., modulation precision, modulation strain, higher harmonic wave detection, adjacent channel leak, and the like from a spectrum having a predetermined frequency range) are executed, and analysis result is outputted onto a screen of a display, and the like.

In this case, for the signal analysis apparatus such as a spectrum analyzer, in order to shorten the measuring operation time, as well as the aforementioned signal analysis processing, in the signal analysis apparatus, there is a demand for increasing the number of sweeps of YTO per second as much as possible.

This is achieved by the YTO performing a first sweep in the predetermined frequency range (e.g., 3 to 8 GHz as described above), and subsequently changing the frequency to a next-sweep start frequency as quickly as possible so that the YTO performs the next sweep.

However, the conventional YTO drive circuit 50 cannot increase the number of sweeps for the following reason.

The reason lies in that a shift time (back time) between a first sweep end and the next sweep start of the YTO cannot be shortened to a certain degree or less in the conventional YTO drive circuit 50.

This is because a control current cannot be changed at a high speed in the back time in the constant-current circuit 53 in the conventional YTO drive circuit 50, and much time (about 8 msec) is required for a response before reaching a necessary current value.

The back time is also influenced by the performance of a frequency converter, IF section, CPU, and the like disposed in the signal analysis apparatus, but is most influenced by the response speed of current control in the constant-current circuit 53. Therefore, a solution for shortening the back time has been desired.

DISCLOSURE OF THE INVENTION

The present invention has been developed to solve the aforementioned problem, and an object thereof is to provide a signal analysis apparatus provided with a YTO in which a response property of current control to the YTO is enhanced and an oscillation frequency can be changed in a short time.

According to one aspect of the present invention, there is provided a signal analysis apparatus provided with a YTO, which has the YTO (5a), receives an input signal, mixes the input signal and an oscillation frequency of the YTO, extracts an intermediate frequency signal, and analyzes the input signal over a desired frequency range, the signal analysis apparatus comprising:

a current drive circuit (21) for supplying a current corresponding to the oscillation frequency of the YTO;

sweep control means (9) for supplying a current to the YTO from the current drive circuit in such a manner that frequencies corresponding to a first range in the oscillation frequency of the YTO designated as the desired frequency range for analysis with one sweep, and a second range designated as a frequency range higher than the first range for the analysis with the next sweep are oscillated by the YTO, and for generating an instruction signal for increasing the current flowing through the YTO over a part of a period between an end of the first range and a start of the second range in order to shorten the period between the end of the first range and the start of the second range when it is detected that a difference between an end frequency of the first range and a start frequency of the second range is larger than a predetermined frequency difference; and a bias circuit (20) for receiving the instruction signal from the sweep control means and forming a bias for increasing the current from the current drive circuit.

The bias circuit (20) comprises:

a diode (26), disposed at one end of a terminal of the YTO (5a), for grounding the terminal; and switch means (25) for changing the supply of a power source of an operation voltage of the YTO with respect to one end of the terminal of the YTO, and may be constituted to supply the power source to one end of the terminal of the YTO via the switch means when a sweep interval control signal of the sweep control means (9) is ON, and to ground one end of the terminal of the YTO via the diode when the control signal is OFF.

Moreover, the signal analysis apparatus further comprises logic reverse means (33) for reversing the logic of a switch operation of the switch means (25), and ON/OFF of the switch means can be operated by turning OFF/ON the sweep interval control signal of logic reverse.

In the aforementioned constitution, the current drive circuit 21 subjects the oscillation frequency of the YTO 5a to current control in response to a sweep signal.

The sweep control means 9 outputs the ON sweep interval control signal to the YTO bias circuit 20 when the difference between the frequency of the first sweep end and the frequency of the next sweep start is large.

The YTO bias circuit 20 turns ON FET 25 and supplies a voltage corresponding to the operation voltage of the YTO 5a when the sweep interval control signal is ON.

When a rising of a current value passed to the YTO 5a by the current drive circuit 21 in accordance with the bias voltage can be steepened, a back time is shortened, and response speed of the current control can be increased.

When the difference between the frequency of the first sweep period or the sweep end and the frequency of the next sweep start is small, the YTO bias circuit 20 is OFF and does not waste power.

BRIEF DESCRIPTION OF THE DRAWINGS

FIG. 1 is a block diagram showing a whole constitution of a signal analysis apparatus provided with a YTO of the present invention.

Figure 2:
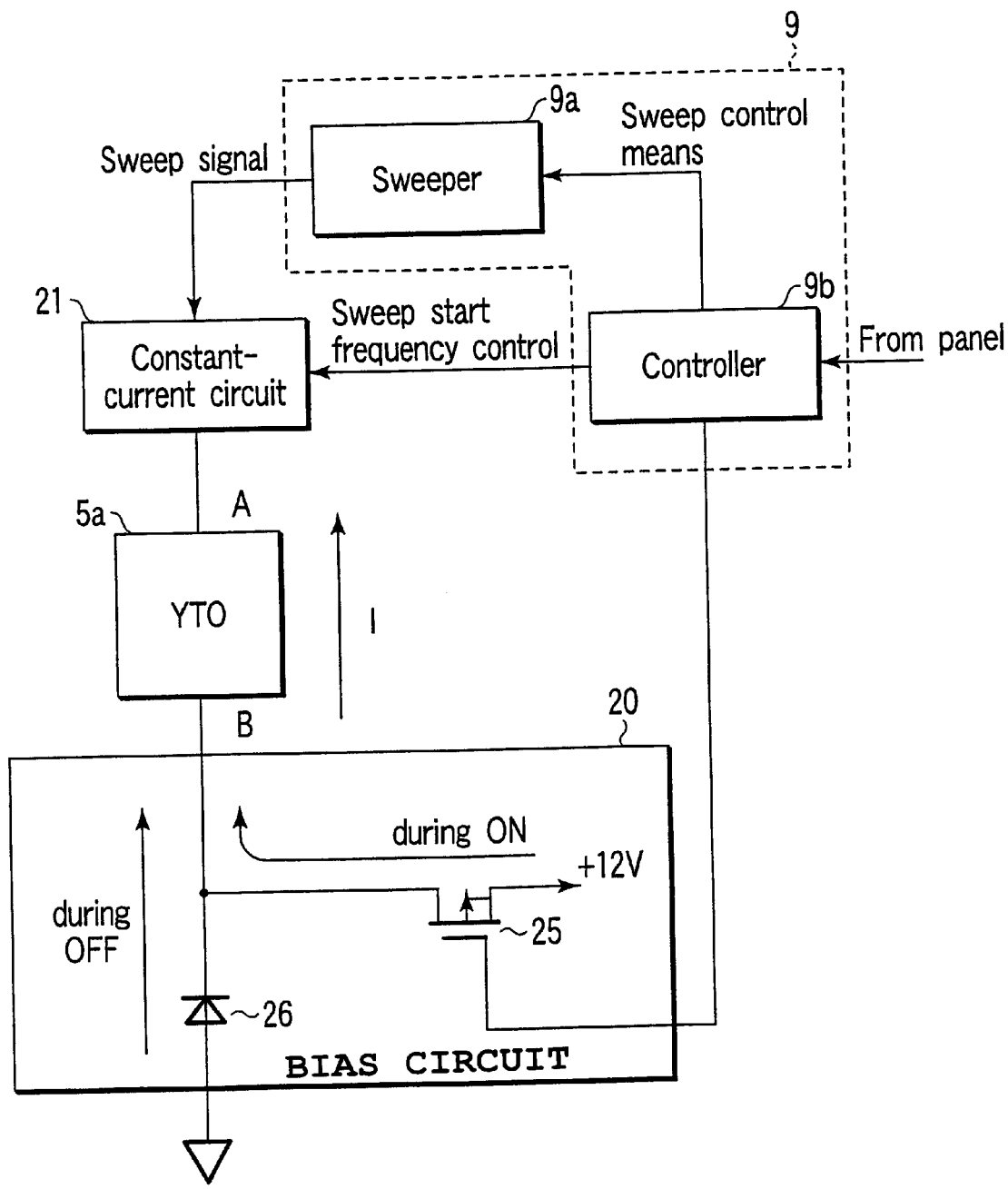
FIG. 2 is a block diagram showing an inner constitution of a YTO drive circuit provided with a bias circuit 20 of the YTO used in a local oscillator 5 of FIG. 1.

Best Mode for Carrying Out of the Invention

Respective embodiments of the present invention will be described hereinafter with reference to the drawings.

FIRST EMBODIMENT

FIG. 1 is a block diagram showing a whole constitution of a signal analysis apparatus provided with a YTO bias apparatus according to a first embodiment of the present invention.

Examples of the signal analysis apparatus include a transmitter tester and a spectrum analyzer.

The signal analysis apparatus in the example of FIG. 1 is a spectrum analyzer, and performs analysis processing of analyzing modulation precision, modulation strain, higher harmonic wave detection, adjacent channel leak, and the like from a spectrum having a predetermined frequency range of an input signal, and outputting an analysis result onto a display, and the like.

A high-frequency signal a to be tested is inputted via an input terminal 1, adjusted by an attenuator 2 to indicate a predefined level, and inputted to a frequency converter 3.

The high-frequency tested signal a inputted to the frequency converter 3 is mixed with a local oscillation signal b from a local oscillator 5 with a YTO used therein as described later by a signal mixer 4, and converted to an intermediate frequency signal having an intermediate frequency.

The intermediate frequency signal is limited in band by a band pass filter (BPF) 6, mixed again with a local oscillation signal b1 from a local oscillator 8 by another signal mixer 7, and outputted as a final intermediate frequency signal c from the frequency converter 3.

An oscillation frequency of the local oscillator 5 of the frequency converter 3 is swept over a predetermined frequency range set from a panel, and the like by sweep control means 9.

As a result, a frequency f1 of the intermediate frequency signal c outputted from the frequency converter 3 also changes in synchronism with a sweep operation.

The intermediate frequency signal c with a reduced frequency outputted from the frequency converter 3 is next inputted to a resolution band width (RBW) filter 10.

The RBW filter 10 has a band pass filter (band variable filter) for removing an unnecessary frequency components, and selecting only the necessary intermediate frequency signal.

A band width (RBW) in a point at which a level drops from a peak level by 3 dB in a pass center frequency fC of a frequency property of the band pass filter represents a frequency resolution in the spectrum analyzer.

Moreover, since the frequency f1 of the intermediate frequency signal c outputted from the frequency converter 3 changes in synchronism with the sweep operation, an output signal outputted from the RBW filter 10 in one sweep period (sweep cycle) with an elapse of time forms a time series waveform in respective frequency components of the tested signal swept/received and converted to the intermediate frequency signal c.

Subsequently, the output signal from the RBW filter 10 is subjected to gain adjustment by an amplifier 11 and then subjected to logarithm conversion by a logarithm (LOG) converter 12.

The output signal whose signal level is converted in a dB unit by the LOG converter 12 is next detected by a detector 13.

As a result, the signal detected in the sweep period indicates a size of the time series waveform in the swept frequency.

Therefore, when the detected signal indicating the size of the time series waveform in the swept frequency from the detector 13 is represented with the abscissa indicating the frequency, and the ordinate indicating an amplitude, a frequency spectrum waveform is obtained.

The signal indicating the frequency spectrum waveform outputted from the detector 13 is next inputted to a video band width (VBW) filter 14.

The VBW filter 14 is constituted of a low pass filter (LPF) for removing a high frequency component (noise component) of the frequency spectrum waveform finally displayed in a display 17 attached to a front panel of the spectrum analyzer.

For the analog frequency spectrum waveform outputted from the VBW filter 14, a peak value in each time axis position is detected by a peak detector (not shown), and a final frequency spectrum waveform whose envelope is detected is obtained.

The signal indicating the final frequency spectrum waveform is next converted to digital data by an A/D converter 16.

The frequency spectrum waveform converted to the digital data is displayed in the aforementioned display 17.

Therefore, the frequency spectrum waveform of the signal a to be measured is displayed/outputted onto the display 17.

Additionally, when a sweep frequency range and display range of the frequency on the display 17 are changed, a frequency spectrum can be measured over a broad frequency range, as determined by the user.

FIG. 2 is a block diagram showing a YTO drive circuit provided with a YTO bias circuit 20 as a main part of the present invention.

A YTO 5a constitutes a part of the local oscillator 5 of the frequency converter 3 of FIG. 1.

Moreover, a sweeper 9a and controller 9b constitute the sweep control means 9.

A current drive circuit 21 as a constant-current circuit is connected to one end of a terminal A of the YTO 5a, and a control current to the YTO 5a is variably controlled.

A sawtooth-shaped sweep signal is inputted to the current drive circuit 21 as the constant-current circuit from the sweeper 9a, and the current to the YTO 5a is controlled so as to sweep the oscillation frequency of the YTO 5a in a predetermined frequency range.

Moreover, when a sweep start frequency fs is inputted from the controller (CPU) 9b, the current is controlled to obtain the corresponding current.

The YTO bias circuit 20 is connected to a terminal B (ground side) of the YTO 5a, and is constituted of a metal oxide silicon film (MOS) field effect transistor (FET) 25 and diode 26.

Here, a voltage of +12V from the power source is applied to a source of the FET 25.

Moreover, a drain of the FET 25 is connected in parallel to the YTO 5a via a cathode of the diode 26.

Additionally, an anode of the diode 26 is grounded.

Moreover, a sweep interval control signal (ON/OFF) from the controller 9b is inputted to a gate of the FET 25.

Furthermore, the controller 9b detects a difference between a frequency f2 of a point at which a first sweep ends, and a next-sweep start frequency f3, and outputs a control signal for turning ON the FET 25 when the difference between f2 and f3 reaches a predetermined value or more.

Thereby, if the FET 25 turns ON, the voltage of +12V is applied to the terminal B of the YTO 5a via the source/drain.

Figure 3:
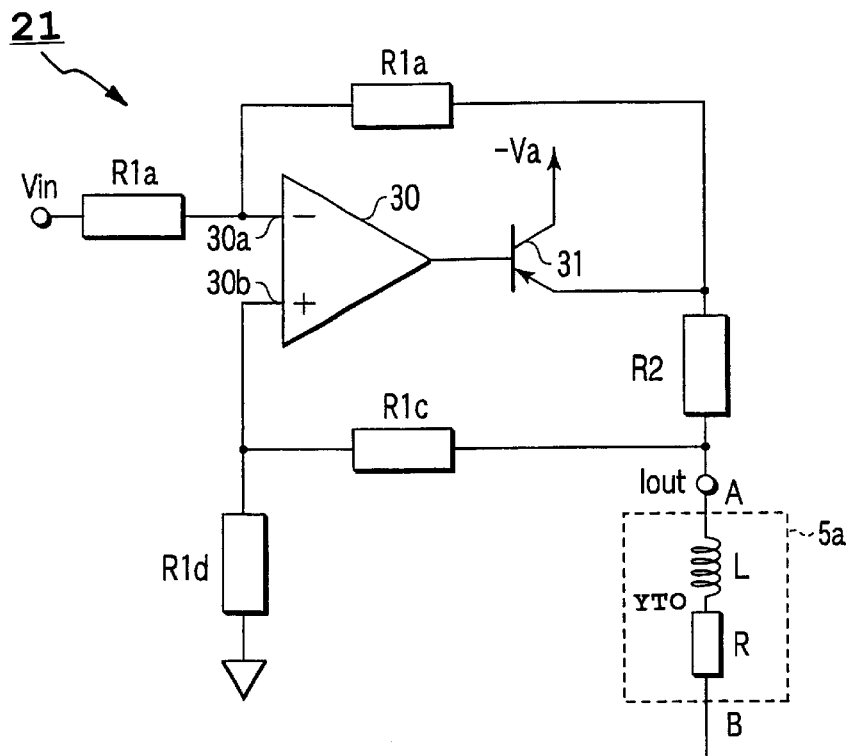
FIG. 3 is a circuit diagram showing an inner constitution of a current drive circuit 21 of FIG. 2.

FIG. 3 is a circuit diagram showing an inner constitution of the current drive circuit 21 as the constant-current circuit of FIG. 2.

The sweep signal from the sweeper 9a is inputted to an input terminal Vin.

The sweep signal is a voltage corresponding to the sweep frequency.

The input terminal Vin is connected to a negative phase (−) input terminal 30a of an operational amplifier (hereinafter referred to as an op. amp.) 30 via a resistance R1a.

An output of the op. amp. 30 is connected to a base of a transistor 31.

A negative voltage −Va is applied to a collector of the transistor 31.

An emitter of the transistor 31 is connected to the negative phase (−) input terminal 30a and a positive phase (+) input terminal 30b of the op. amp. 30 via feedback resistances R1b, R1c having the same resistance value.

That is, the transistor 31 is connected as a so-called emitter follower.

A subsequent stage (emitter) of the transistor 31 is connected to one end of an inner load resistance R2 in a feedback path on a + side.

The other end of the inner load resistance R2 is connected to the feedback resistance R1c and output terminal Iout.

Moreover, the positive phase (+) input terminal 30a of the op. amp. 30 is grounded via a resistance R1d.

The output terminal Iout is connected to one terminal A of the YTO 5a.

The resistance values of the resistances R1a, R1b, R1c, R1d are all sufficiently high values as compared with the resistance value of the inner load resistance R2, and are, for example, 1 kΩ.

Moreover, the resistance value of the inner load resistance R2 is a sufficiently low value as compared with the resistance values of the resistances R1a, R1b, R1c, R1d and is, for example, 10Ω.

Furthermore, the YTO 5a is represented by an equivalent circuit constituted by a coil L and resistor R as shown in the drawing, and has a predetermined time constant decided by RL.

The current drive circuit 21 as the constant-current circuit outputs a current I=−(Vin)/10(Ω) corresponding only to the voltage applied to the input terminal Vin via the output terminal Iout.

Moreover, the current drive circuit 21a provides a constant current which is not influenced by a voltage fluctuation from Iout.

Figure 4:
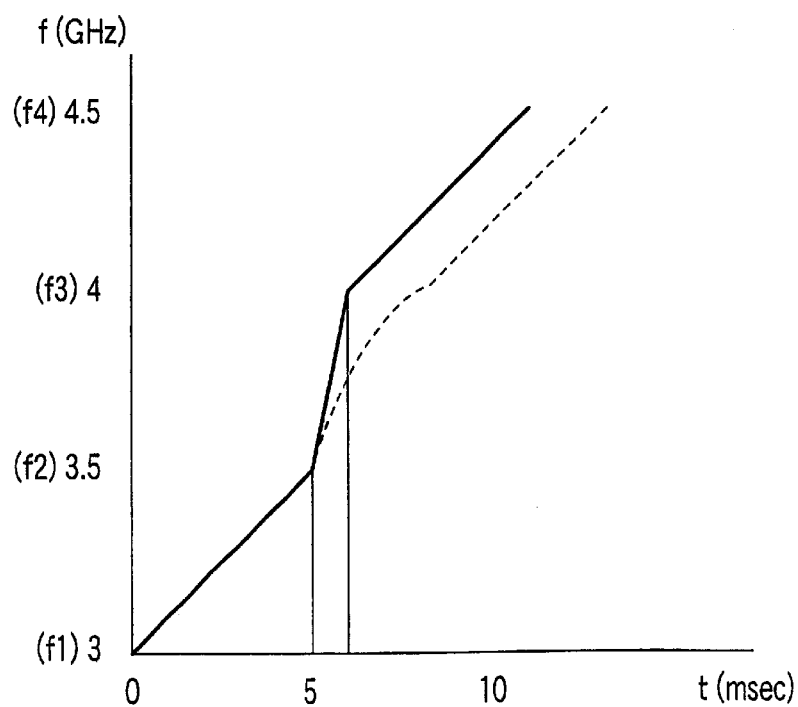
FIG. 4 is a timing chart showing an action of bias voltage application to the YTO by the bias circuit 20 of FIG. 2.

FIG. 4 is a timing chart showing a change of the sweep frequency of the YTO 5a.

As shown in FIG. 4, it is assumed that when a first range of f1 to f2, and a second range of f3 to f4 are designated to be swept and analyzed, for example, a range of 3 GHz (f1) to 3.5 GHz (f2) is analyzed with a first sweep, and the next sweep start frequency f3 is 4 GHz.

During sweeping, the current controlled by the current drive circuit 21 flows through the YTO 5a to terminal B-A.

In this case, the YTO bias circuit 20 (FET 25) is OFF, and the current flows to the YTO 5a from a ground end GND via the diode 26.

During the end of the first sweep, the controller 9b of the sweep control means 9 detects the difference between the frequency f2 during the end and the next sweep start frequency f3, and outputs a sweep interval control signal (+V) for turning ON the FET 25 when it is judged that the difference is a predetermined value or more.

An output time of the sweep interval control signal differs with the difference between f2 and f3.

Thereby, when the FET 25 turns ON, the terminal B of the YTO 5a is biased at the voltage of +12V.

The voltage of +12V is a voltage corresponding to an operation voltage of the YTO 5a.

When the current drive circuit 21 as the constant-current circuit increases the current value in this state, the voltage between the terminals A and B of the YTO 5a is high, a rise of the current value can therefore be steepened (as shown by a solid line in the drawing), and the oscillation frequency of the YTO 5a can be quickly raised to the next sweep start frequency f3 in a short time.

Figure 6:
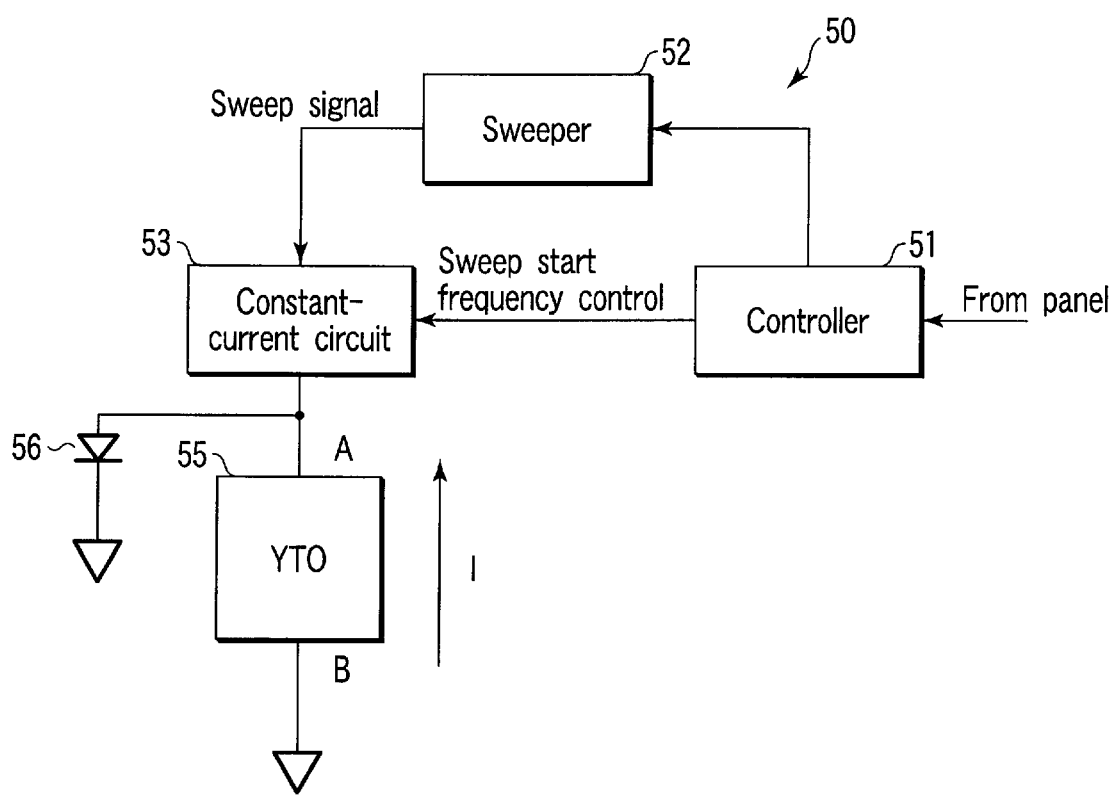
FIG. 6 is a block diagram showing a YTO drive circuit according to a related art.

Additionally, a dotted line in FIG. 4 shows a state in which the YTO bias circuit 20 is not disposed (corresponding to a prior art shown in FIG. 6).

It is seen that according to the present invention a response speed for changing the sweep frequency can be enhanced as compared with the prior art.

That is, in the prior art, about 8 msec at maximum is required as the response speed for changing the sweep frequency, while in the present invention the time can be shortened to 1 msec at maximum.

SECOND EMBODIMENT

Figure 5:
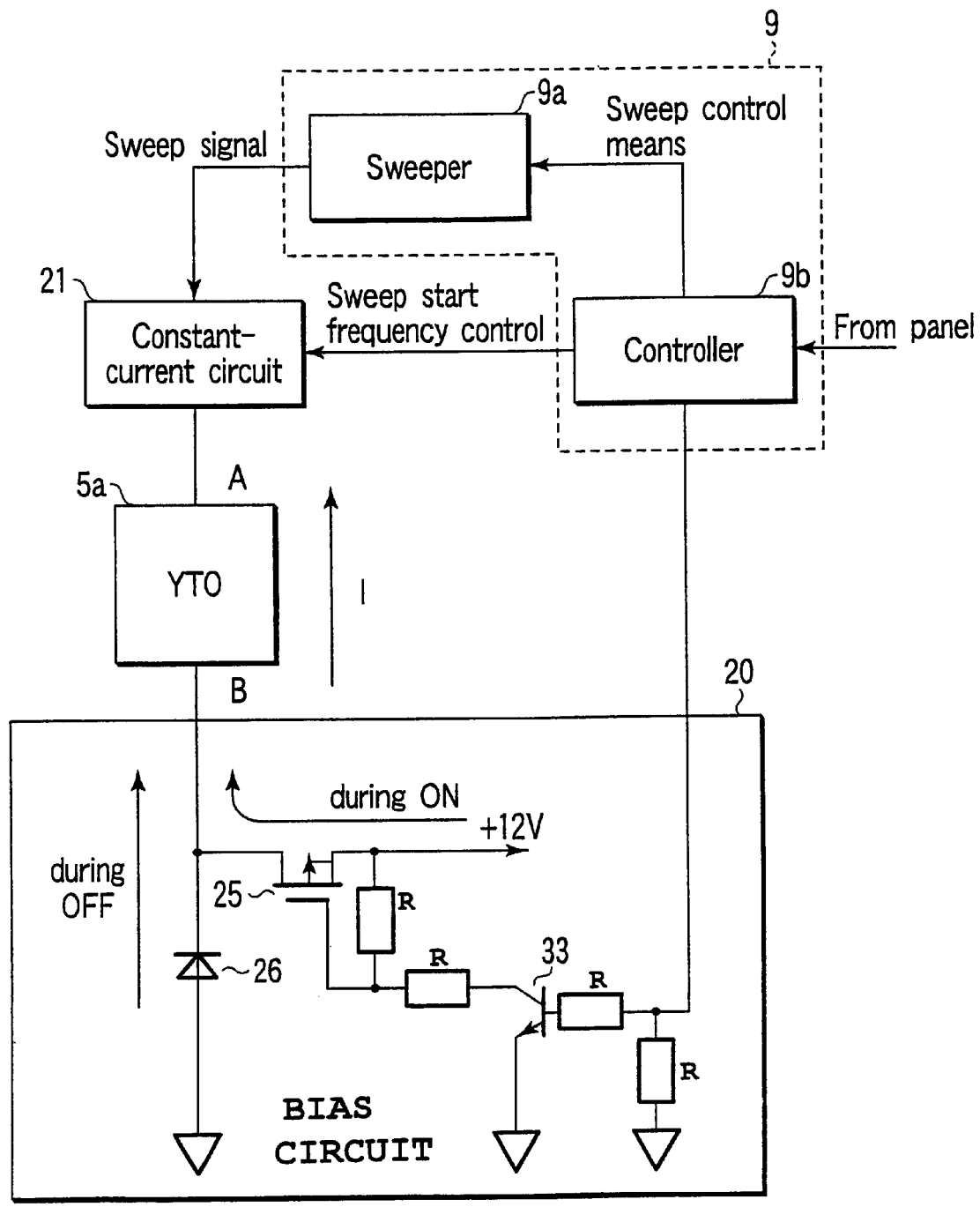
FIG. 5 is a block diagram showing another inner constitution of the YTO drive circuit provided with the bias circuit 20 of the YTO used in the local oscillator 5 of FIG. 1.

Moreover, FIG. 5 is a block diagram showing the YTO drive circuit provided with the YTO bias circuit 20 as the main part of the present invention for use in a second embodiment of the present invention.

The YTO bias circuit 20 shown in FIG. 5 is similar to the YTO bias circuit 20 shown in FIG. 2, except that means is disposed for reversing a logic of the sweep interval control signal from the controller 9b shown in FIG. 2 to drive the FET 25 shown in FIG. 2.

That is, as shown in FIG. 5, the sweep interval control signal from the controller 9b is inputted to a base of a transistor 33.

An emitter of the transistor 33 is grounded, and a collector thereof is connected to the gate of the FET 25.

Thereby, when the sweep interval control signal of the controller 9b turns ON (+V) and the transistor 33 turns ON, the gate of the FET 25 turns OFF. Therefore, the voltage of +12V is not applied to the YTO 5a.

On the other hand, when the sweep interval control signal of the controller 9b is OFF, the gate of the FET 25 turns ON, and the voltage of +12V is applied to the YTO 5a.

In this manner, the logic of the sweep interval control signal can be reversed in accordance with the logic inside the controller 9b by the aforementioned constitution.

When the next sweep start frequency is lower than the frequency after the end of the sweep (during repeated sweep), that is, when the current flowing through the YTO 5a falls, the falling is performed more quickly than the rising due to the properties of the constant-current circuit 21. It has also been confirmed that the current falls in about 1 msec at maximum.

Additionally, respective sweep start frequency control signals corresponding to f1 and f3 form an offset voltage applied to the op. amp. 30 of the constant-current circuit 21 by the controller 9b.

The YTO bias circuit 20 described in the present embodiment temporarily operates only in a short time during shifting of the oscillation frequency of the YTO 5a, and does not operate during a sweep time. Therefore, power is not wasted.

According to the present invention, when the difference between the sweep end frequency and the next sweep start frequency is large, the bias voltage is supplied to the YTO in the constitution. Therefore, the rise of the current value to the YTO is steepened, the back time can be shortened, and the response speed can be increased.

Moreover, by the constitution in which switching means is disposed to switch applications of the bias voltage, the application of the bias voltage is performed in a short time, and the switch means is set to be inoperative during the sweep period so that the power wastage can be prevented.

Furthermore, when logic reverse means is simply disposed in accordance with the logic of the sweep interval control signal of the sweep control means, the switch means can be operated in accordance with the logic of the control means.

Consequently, as described above in detail, according to the present invention, there can be provided a signal analysis apparatus provided with the YTO in which the response property of current control to the YTO is enhanced and the oscillation frequency can be changed in a short time.

What is claimed is:

1. A signal analysis apparatus provided with a YTO, which has the YTO, receives an input signal, mixes the input signal and an oscillation frequency of said YTO, extracts an intermediate frequency signal, and analyzes said input signal over a desired frequency range, said signal analysis apparatus comprising:

a current drive circuit for supplying a current corresponding to the oscillation frequency of the YTO;

sweep control means for supplying a current to said YTO from said current drive circuit in such a manner that frequencies corresponding to a first range in the oscillation frequency of said YTO designated as said desired frequency range for analysis with one sweep, and a second range designated as a frequency range higher than said first range for the analysis with the next one sweep are oscillated by said YTO, and for generating an instruction signal for increasing the current flowing through said YTO over a part of a period between an end of said first range and a start of said second range in order to shorten the period between the end of said first range and the start of said second range when it is detected that a difference between an end frequency of said first range and a start frequency of said second range is larger than a predetermined frequency difference; and a bias circuit for receiving the instruction signal from said sweep control means and forming a bias for increasing the current from said current drive circuit.

2. The signal analysis apparatus provided with the YTO according to claim 1, wherein said current drive circuit outputs a predetermined current corresponding only to a voltage applied to an input terminal from an output terminal, and operates as a constant-current circuit which can output said predetermined current without being influenced by a voltage fluctuation on a side of said output terminal.

3. The signal analysis apparatus provided with the YTO according to claim 2, wherein said current drive circuit comprises:

the input terminal to which a sweep signal of the voltage corresponding to a sweep frequency is inputted from a sweeper;

an operational amplifier having a negative phase (−) input terminal connected to said input terminal via a first resistance R1a, and a positive phase (+) input terminal grounded via a second resistance R1d;

a transistor having a base connected to an output end of said operational amplifier, an emitter connected to the negative phase (−) input terminal and the positive phase (+) input terminal of said operation amplifier via first and second feedback resistances R1b and R1c having the same resistance value, respectively, and a collector with a negative voltage −Va applied thereto to form an emitter follower;

an internal load resistance R2 having one end and the other end connected between said second feedback resistance R1c and the emitter of said transistor 31; and an output terminal connected to the other end of said internal load resistance R2.

4. The signal analysis apparatus provided with the YTO according to claim 3, wherein the resistance values of said resistances R1a, R1b, R1c, R1d are all sufficiently high values including 1 kΩ as compared with the resistance value of said inner load resistance R2, and the resistance value of said inner load resistance R2 is a sufficiently low value including 10 Ω as compared with the resistance values of said resistances R1a, R1b, R1c, R1d.

5. The signal analysis apparatus provided with the YTO according to claim 4, wherein said current drive circuit outputs a current I=−(Vin)/10 (Ω) corresponding only to a voltage Vin applied to said input terminal and the resistance value of said inner load resistance R2 from said output terminal.

6. The signal analysis apparatus provided with the YTO according to claim 1, wherein said sweep control means comprises:

a sweeper for controlling the current to the YTO in such a manner that a sawtooth-shaped sweep signal is inputted to said current drive circuit to sweep the oscillation frequency of said YTO in a predetermined frequency range; and a controller for controlling the current in such a manner that the current from said current drive circuit forms a current corresponding to a sweep start frequency fs during input of the sweep start frequency fs.

7. The signal analysis apparatus provided with the YTO according to claim 6, wherein said bias circuit comprises:

an FET having a drain connected to a ground side of said YTO, and a source with a voltage of +12V applied thereto; and a diode having a cathode connected to said YTO, and an anode grounded, and a sweep interval control signal from said controller is inputted to a gate of said FET.

8. The signal analysis apparatus provided with the YTO according to claim 7, wherein said controller detects a difference between a frequency f2 of a point at which a first sweep ends, and the next sweep start frequency f3, and outputs a control signal for turning ON said FET 25 when the difference between f2 and f3 is a predetermined voltage or more, so that the FET of said bias circuit turns ON, and a bias voltage of +12V is applied to said YTO via the source/drain.

9. The signal analysis apparatus provided with the YTO according to claim 7, wherein said bias circuit comprises means for reversing a logic of the sweep interval control signal from said controller to drive said FET.

10. The signal analysis apparatus provided with the YTO according to claim 9, wherein said bias circuit further comprises a transistor having an emitter grounded, a base with the sweep interval control signal from said controller inputted thereto, and a collector connected to the gate of said FET, so that the sweep interval control signal of said controller turns ON (+V), said transistor turns ON, then the gate of said FET turns OFF, and therefore the voltage of +12V is not applied to said YTO, and the sweep interval control signal from said controller is OFF, then the gate of said FET turns ON, and the voltage of +12V is applied to said YTO.

* * * * *